(12) United States Patent
Lee et al.

(10) Patent No.: US 10,324,130 B2
(45) Date of Patent: Jun. 18, 2019

(54) TEST DECOMPRESSOR AND TEST METHOD THEREOF

(71) Applicant: NATIONAL CHENG KUNG UNIVERSITY, Tainan (TW)

(72) Inventors: Kuen-Jong Lee, Tainan (TW); Jhen-Zong Chen, Pingtung County (TW)

(73) Assignee: National Cheng Kung University, Tainan (TW)

(*) Notice: Subject to any disclaimer, the term of this patent is extended or adjusted under 35 U.S.C. 154(b) by 94 days.

(21) Appl. No.: 15/479,580

(22) Filed: Apr. 5, 2017

(65) Prior Publication Data

US 2018/0120378 A1 May 3, 2018

(30) Foreign Application Priority Data

Nov. 1, 2016 (TW) .............................. 105135393 A

(51) Int. Cl.
*G01R 31/3185* (2006.01)
*G01R 31/28* (2006.01)
(Continued)

(52) U.S. Cl.
CPC . *G01R 31/318533* (2013.01); *G01R 31/2851* (2013.01); *G01R 31/31937* (2013.01); *G06F 11/25* (2013.01)

(58) Field of Classification Search
CPC ...... G01R 31/318533; G01R 31/31937; G01R 31/2851; G06F 11/25
See application file for complete search history.

(56) References Cited

U.S. PATENT DOCUMENTS

| 2002/0112199 A1 | 8/2002 | Whetsel |
|---|---|---|
| 2003/0131298 A1 | 7/2003 | Rajski et al. |

(Continued)

FOREIGN PATENT DOCUMENTS

| CN | 101778293 A | 7/2010 |
|---|---|---|
| CN | 101821641 B | 9/2013 |

(Continued)

OTHER PUBLICATIONS

L. T. Wang et al., "VLSI Test Principles and Architectures: Design for Testability". Boston, MA, USA: Morgan Kaufmann, 2006 (Year: 2006).*

(Continued)

*Primary Examiner* — April Y Blair
*Assistant Examiner* — Rong Tang
(74) *Attorney, Agent, or Firm* — Rosenberg, Klein & Lee

(57) ABSTRACT

A test decompressor and a test method thereof for converting original input data of one single test input into test vectors for testing a circuit under test (CUT) containing scan chains are revealed. The test decompressor includes a test data spreader, a test configuration switch, and a test controller. The test data spreader converts the original input data into a plurality of test data. The test configuration switch receives the original input data and the plurality of test data and transfers these data to scan chains of the CUT. The test controller receives the original input data and outputs a select signal to the test configuration switch for switching current test configuration to another test configuration. The scan chains in the CUT are divided into several scan groups and the scan chains in each scan group share the same test data. Thus the test data volume can be significantly reduced.

8 Claims, 3 Drawing Sheets

(51) Int. Cl.
    G06F 11/25    (2006.01)
    G01R 31/3193    (2006.01)

(56) References Cited

U.S. PATENT DOCUMENTS

2008/0195346 A1\* 8/2008 Lin ................ G01R 31/318575
                                                                                    702/119
2014/0372820 A1    12/2014    Rajski et al.

FOREIGN PATENT DOCUMENTS

| | | |
|---|---|---|
| JP | 201189833 A | 5/2011 |
| TW | 200823476 A | 6/2008 |
| TW | 200842383 A | 11/2008 |

OTHER PUBLICATIONS

Jhen-Zong Chen, Kuen-Jong Lee; Test Stimulus Compression Based on Broadcast Scan with One Single Input; IEEE Transactions on Computer-Aided Design of Integrated Circuits and Systems (vol. 36, Issue 1, Jan. 2017), pp. 184-197.

\* cited by examiner

TEST DECOMPRESSOR AND TEST METHOD THEREOF

BACKGROUND OF THE INVENTION

1. Field of the Invention

The present invention relates to a circuit for testing integrated circuits and a test method thereof, especially to a test decompressor and a test method thereof that convert original input data of test input into test vectors for testing a circuit under test (CUT) containing scan chains. The test data volume can be significantly reduced, typically by a factor of hundreds or even higher, and a certain testable fault coverage is maintained. The scan chains in the CUT are divided into a plurality of scan groups. The scan chains in each scan group share the same test data (vectors) and hence the test data volume is significantly reduced.

2. Description of Related Art

The cost for testing integrated circuits rises along with the increasing complexity of integrated circuits. The high test cost results from large volume of test data, time-consuming test procedure and the number of test inputs. In order to reduce test data volume, test application time and the number of test inputs required, a method for test data compression has been proposed. A test data decompressor is inserted between test inputs and all scan chains. Data input is converted into test vectors for testing circuits. The main concept of the test data compression is to compress all test vectors and reduce the occupied storage space.

Broadcast scan is a popular technique for test data compression. A plurality of scan chains share test data from a test input. However, some faults may become undetectable as some test vectors required for different scan chains may conflict with each other. Thus these test vectors cannot be compressed by broadcast scan, resulting in fault coverage loss. In order to reach the fault coverage required, the previous work based on broadcast scan adds a series of flip-flops between the test input and the scan chains for providing different data to the scan chains. One multiplexer is required to switch different data for each scan chain and transfer the test data required into that scan chain.

However, such method has several shortcomings. First a part of circuit is unable to maintain the original fault coverage owing to reduction in fault coverage. Moreover, the big multiplexer requirement caused by the need of connecting different test data to scan chains and increased inputs of each multiplexer will lead to increased area required by each multiplexer. At last, the number of multiplexers required is increased along with the increasing number of scan chains. This results in high area overhead.

Thus there is room for improvement and a need to provide a test decompressor and a test method thereof to overcome the shortcomings mentioned above.

SUMMARY OF THE INVENTION

Therefore it is a primary objective of the present invention to provide a test decompressor and a test method thereof in which one original input data of one test input is converted into test vectors for testing circuits under test. By dividing scan chains into a number of scan groups, area for switch logic circuit is significantly reduced while 100% testable fault coverage is still achieved. Moreover, the compressor of the present invention requires only one single test input to get test data and control data required. Thus not only the input volume of test data required is dramatically reduced, the high test compression ratio is also achieved.

In order to achieve the above objectives, a test decompressor of the present invention that converts original input data of one test input into at least one test vector for testing a circuit under test (CUT) is provided. The test decompressor includes a test data spreader, a test configuration switch and a test controller. The test data spreader consists of an inverter and a series of flip-flops, respectively receiving the original input data. The series of flip-flops provide different test data by true output or complementary output thereof. The original input data is converted into a plurality of test data by the test data spreader. The test configuration switch is electrically connected to both the test data spreader and the test input, and having a plurality of multiplexers. The test configuration switch receives the original input data and the plurality of test data and then selects test data required by a plurality of scan groups as the test vector transferred to the CUT. The test controller receives the original input data and outputs a select signal to the test configuration switch for switching the multiplexers into different test configurations. The plurality of multiplexers is simplified into an integrated switch logic with the same function by conventional logic minimization. The test controller not only outputs the select signal for switching the current configuration to the desired configuration but also controls the whole test flow.

All scan chains in the CUT are divided into a plurality of scan groups. The scan chains in the same scan group share and receive the same test vector.

The multiplexers are simplified into the integrated switch logic by logic minimization.

In order to achieve the above objectives, a test method of a test decompressor according to the present invention includes the following steps. The test decompressor is composed of a test data spreader, a test configuration switch and a test controller. First send an enable signal to the test controller through one enable input to start the test procedure and output a select signal to the test configuration switch by the test controller upon receiving the enable signal so as to configure a test configuration. Next send one piece of control data to the test controller by one test input and the control data contains a number that indicates the number of test vectors to be used in the test configuration. Then transfer one original input data to the test data spreader by the test input for converting the original input data into a plurality of test data. Next receive the original input data and the plurality of test data, and select test data for a plurality of scan chains of a circuit under test (CUT) as a test vector by the test configuration switch. Then output the test vector to the scan chains of the CUT by the test configuration of the test configuration switch according to the select signal from the test controller and apply the test vector to the CUT to test the CUT. At last, run the third step, the fourth step, and the fifth step repetitively until the test vectors for the current test configuration are transferred to the CUT and then update and output the select signal to the test configuration switch by the test controller for switching the current test configuration to another test configuration.

Run the second step to the last step repetitively in turn until all the test vectors required by all test configurations have been transferred to the CUT.

The test data spreader includes a series of flip-flops formed by a number of L flip-flops and the series of flip-flops provide true output and complementary output. The test configuration switch receives the original input data, an output of the inverter and a number of 2*L output of the series of flip-flops. The maximum is a number of 2+2*L input.

Before starting the test method of the test decompressor, the test controller receives a test enable signal that triggers the test controller to start the test method of the test decompressor.

BRIEF DESCRIPTION OF THE DRAWINGS

The structure and the technical means adopted by the present invention to achieve the above and other objectives can be best understood by referring to the following detailed description of the preferred embodiments and the accompanying drawings, wherein.

DETAILED DESCRIPTION OF THE PREFERRED EMBODIMENT

In order to learn structure, functions, and features of the present invention, please refer to the figures, the following embodiments and related details.

Figure 1:
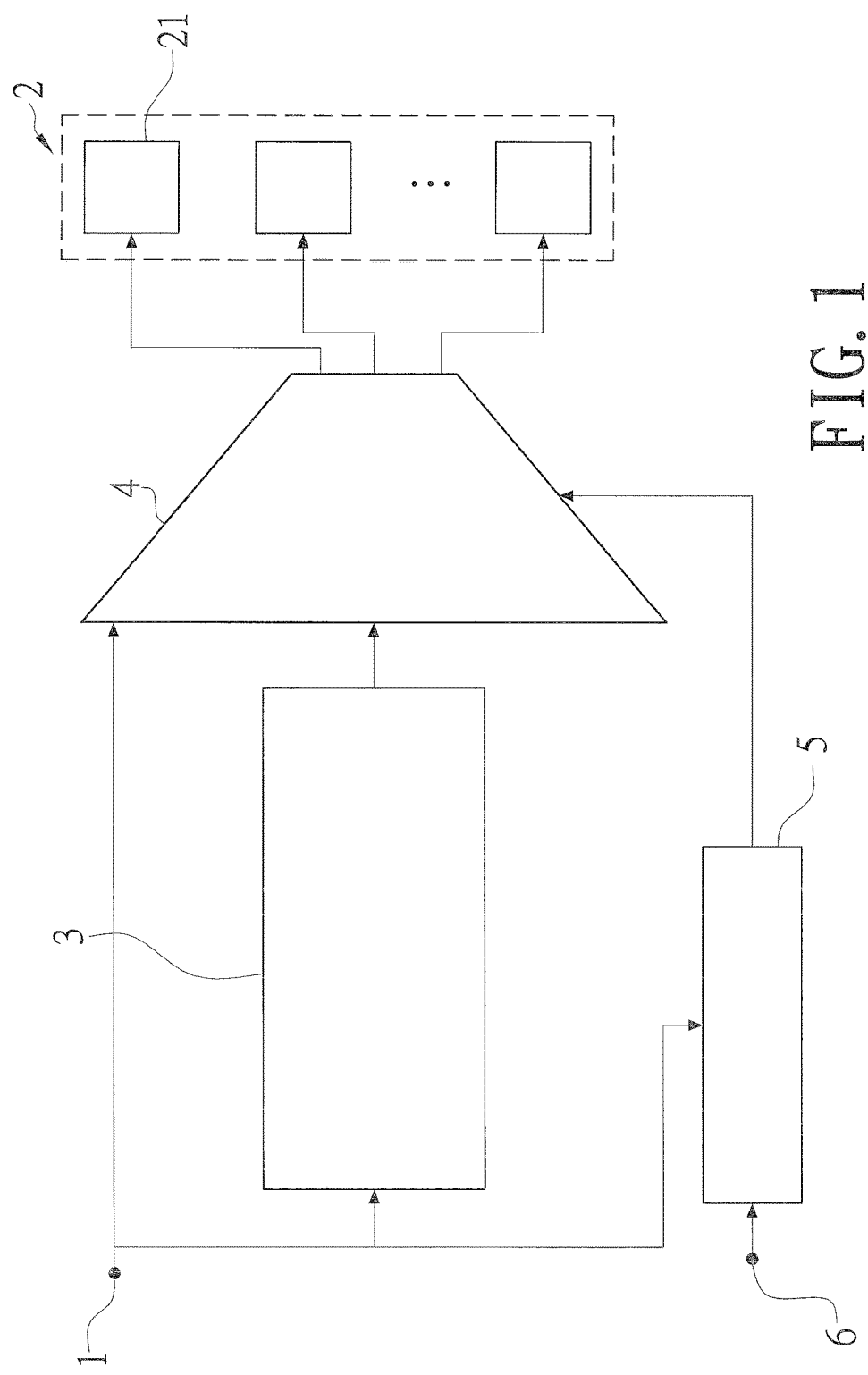
FIG. 1 is a schematic drawing showing structure of an embodiment of a test decompressor according to the present invention.
Figure 2:
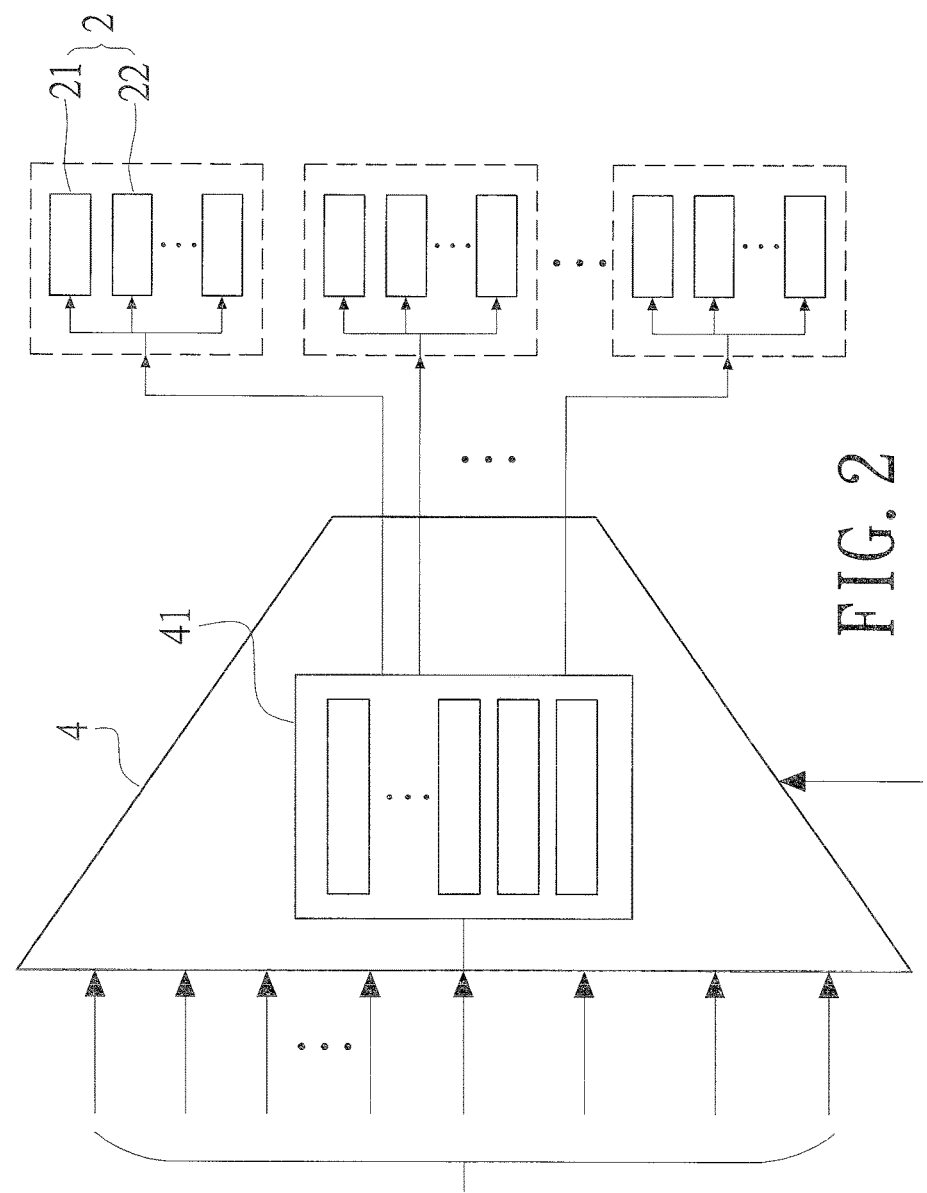
FIG. 2 is a partial enlarged view of an embodiment of a test decompressor according to the present invention.
Figure 3:
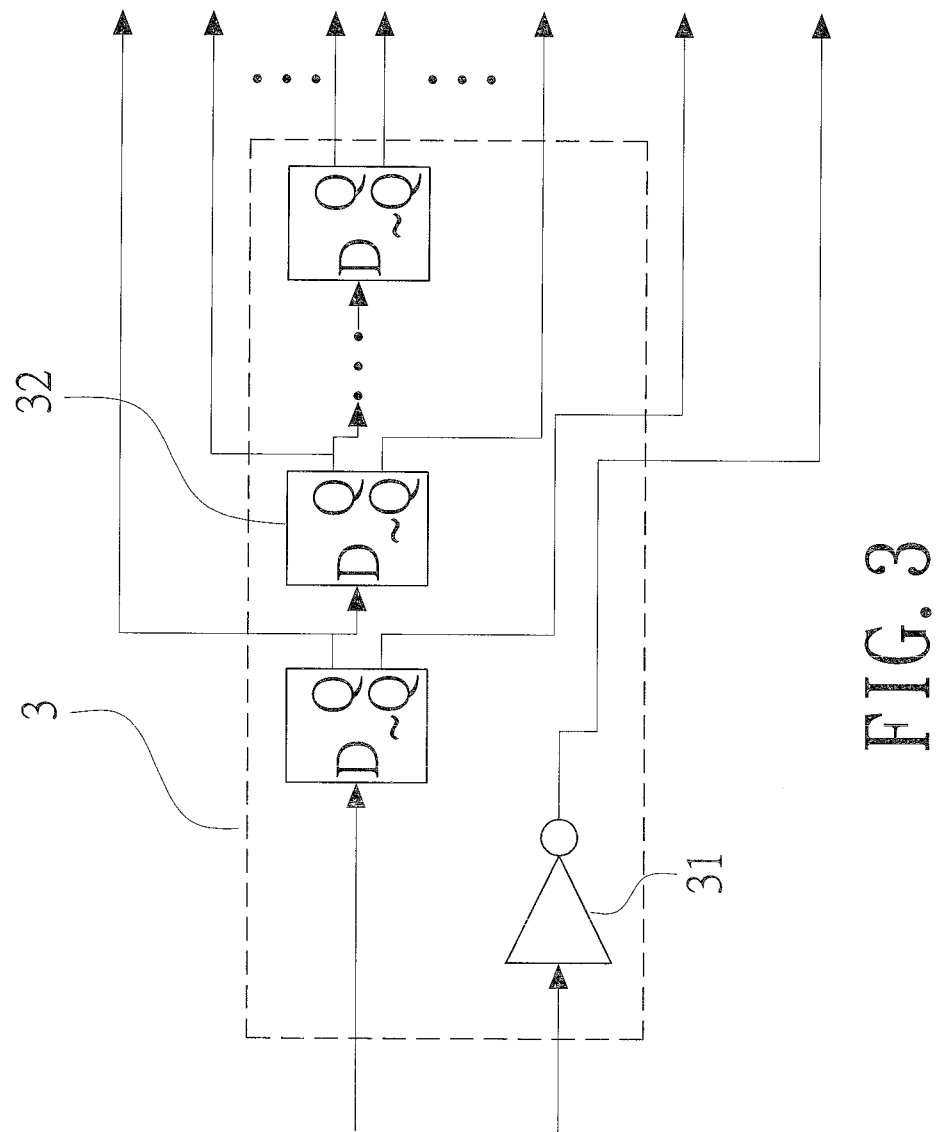
FIG. 3 is another partial enlarged view of an embodiment of a test decompressor according to the present invention.

Refer to FIG. 1, FIG. 2 and FIG. 3. A test decompressor according to the present invention converts one original input data of one test input 1 into a test vector for testing a circuit under test (CUT) 2. The test decompressor includes a test data spreader 3, a test configuration switch 4 and a test controller 5. The test data spreader 3 consists of an inverter 31 and a series of flip-flops 32, respectively receiving the original input data and converting the original input data into a plurality of test data. The series of flip-flops 32 includes a number of L flip-flops. The test configuration switch 4 having a plurality of multiplexers 41 is electrically connected to both the test data spreader 3 and the test input 1 and receiving maximum a number of 2+2*L input. The multiple multiplexers 41 are simplified into an integrated switch logic by logic minimization. The test configuration switch 4 receives the original input data and the plurality of test data, and then selects test data required by a plurality of scan groups 21 as a test vector transferred to the CUT 2. The test controller 5 is used to receive the original input data and a test enable signal 6 that triggers the test controller 5 to start the test procedure. After starting the test procedure, the test controller 5 provides a select signal to the test configuration switch 4 for switching the multiplexers 41 into another test configuration required. All scan chains 22 in the CUT 2 are divided into a plurality of scan groups 21 and the scan chains 22 in the same scan group 21 share and receive the same test vector. Thus complete (100%) testable fault coverage is achieved.

A test method of a test decompressor according to the present invention includes the following steps, wherein the test decompressor consists of a test data spreader 3, a test configuration switch 4 having a plurality of multiplexers 41 and a test controller 5.

Step 1: sending an enable signal to the test controller 5 to start test procedure and outputting a select signal to the test configuration switch 4 by the test controller 5 upon receiving the enable signal so as to configure a test configuration;

Step 2: sending one control data to the test controller 5 by one single test input 1 and the control data containing a number that indicates the number of test vectors to be used in the test configuration;

Step 3: transferring one original input data to the test data spreader 3 by the test input 1 for converting the original input data into a plurality of test data;

Step 4: receiving the original input data and the plurality of test data, and selecting test data required by a plurality of scan groups 21 of a circuit under test (CUT) 2 as the test vector by the test configuration switch 4;

Step 5: outputting the test vector to the CUT 2 by the test configuration of the test configuration switch 4 according to the select signal from the test controller and then applying the test vector to the CUT 2;

Step 6: running the Step 3, the Step 4 and the Step 5 repetitively until all the test vectors for the test configuration are transferred to the CUT 2.

Step 7: updating and outputting the select signal to the test configuration switch 4 by the test controller 5 for switching the test configuration to another test configuration.

Step 8: running the Step 2 through the Step 7 repetitively until all test vectors for all test configurations are transferred to the CUT 2. Thus the fault coverage required is achieved.

In order to learn applications of the present invention, please refer to the following embodiments.

Refer to FIG. 1, FIG. 2 and FIG. 3, the test decompressor of the present invention mainly consists of three main components: the test data spreader 3, the test configuration switch 4 and the test controller 5. The test decompressor is used in combination with a single test input 1 for testing integrated circuits and providing data compression with a very high compression ratio. Moreover, a plurality of scan chains 22 in the circuit under test (CUT) 2 is divided into a plurality of scan groups 21 and all the scan chains 22 in the same scan group 21 share the same test vector, without reducing the fault coverage. Thus each multiplexer 41 transfers test data to one scan group 21 instead of only one scan chain 22. Therefore the number of the multiplexers 41 required is dramatically reduced and on-chip area of test decompressor is decreased. By conventional logic minimization, the multiplexers 41 are simplified into an integrated switch logic circuit having the same function with a plurality of switch logic units. Thus the test cost reduction of the integrated circuit is further achieved.

While performing test, the test enable signal 6 is first sent from the outside to the test controller 5 for starting the test procedure and configuring the first test configuration for the test configuration switch 4. Then the single test input 1 provides one control data to the test controller 5 and one original input data into the test data spreader 3. The control data is the number of test vectors for the current test configuration, which is used to control the switching of the test configuration switch 4. The inverter 31 and the flip-flops 32 of the test data spreader 3 convert the original input data into a plurality of test data. Then the test configuration switch 4 receives the original input data and the plurality of test data and selects test data required by the plurality of scan groups 21 of the CUT 2 as the test vector according to the current test configuration. All the scan chains 22 in the same scan group 21 share the same input data or test data. The test vector is then applied to the CUT 2 containing the scan groups 21 to complete the testing of one test vector.

Now if the control data in the test controller 5 indicates that at least one more test vector will be used for the current test configuration, then a new test data is input from the single test input 1 to the test data spreader 3. Then the inverter 31 and the flip-flops 32 of the test data spreader 3 convert the input data into a plurality of test data and the test configuration switch outputs the test vector to the scan groups 21 of the CUT 2 according to the current test configuration again.

When all test vectors for the current test configuration are applied to the CUTs. The test controller 5 outputs a signal to the test configuration switch 4 to switch to a new test configuration. A new control data is then input from the single test input 1 to the test controller 5 and the first test data for the new configuration is input from the single test input 1 to the test data spreader 3. Then test configuration switch 4 receives the original input data and the plurality of test data and selects test data required by the plurality of scan groups 21 of the CUT 2 as the test vector according to the current test configuration. All the scan chains 22 in the same scan group 21 again share the same input data or test data. The test vector is then applied to the CUT 2 containing the scan groups 21 to complete the testing of the current test vector.

The same test procedure is then carried out for all test vectors in the current test configuration. This process continues until all test vectors for all test configurations are applied to the CUT 2. When the last test vector for the last test configuration is applied to the CUT 2, the test procedure is completed.

The test decompressor of the present invention allows the compression ratio to increase hundreds of times or even thousands of times. This helps reduce the space occupied and achieves 100% testable fault coverage. The application of the present test decompressor to the test of integrated circuits can significantly reduce the test cost.

Compared with techniques available now, the present invention has the following advantages:

1. The inverter and the series of flip-flops of the test decompressor and the test method thereof according to the present invention provide data different from the original input data to the test configuration switch. Then the test configuration switch selects the test data required as the test vector for testing the integrated circuit. A plurality of test data is provided for testing different scan chains (groups) of different integrated circuits.

2. One of the multiplexers is responsible to drive one scan group instead of one scan chain. Compared with the conventional structure and method, the multiplexer of the present invention directly transfers the test vector to one scan group for reducing the space occupied. Moreover, the multiplexers are simplified into an integrated switch logic with the same function by conventional logic minimization. The test cost of integrated circuits is significantly reduced.

3. The scan chains of the present invention are divided into a plurality of scan groups. The scan chains in the same scan group share the same test vector. Compared with the lower fault coverage resulted from the test vectors that are not compatible with each scan chain completely, the present invention achieves 100% testable fault coverage by dividing the scan chains with compatible test data into the same scan group. Thus the compression is carried out smoothly.

In summary, the test decompressor and the test method thereof according to the present invention can achieve the expected functions.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A test decompressor converting original input data through one single test input to at least one test vector for testing a circuit under test (CUT), comprising:
   a common test input terminal;
   a test data spreader operatively coupled to said common test input terminal for receiving an original input data therefrom, said test data spreader having an inverter and a series of flip-flops;
   a test configuration switch electrically connected to the test data spreader and said common test input terminal, said test configuration switch having a plurality of multiplexers; and
   a test controller coupled, by one input thereof, to said common test input terminal for receiving the original input data and a control data therefrom, and, by another input thereof, to a test enable signal, said test controller being configured to generate a select signal responsive to said original input data, control data, and enable signal, said select signal being sent to the test configuration switch for switching the multiplexers thereof to a plurality of test configurations required;
   wherein the inverter and the flip-flops of said test data spreader are configured to receive the original input data from said common test input terminal, respectively, and to convert the original input data into a plurality of test data, said plurality of test data being coupled to said test configuration switch;
   wherein each of the series of flip-flops of said test data spreader provides a true output and a complementary output;
   wherein the test configuration switch receives the original input data from said common test input terminal and the plurality of test data from said test data spreader and selects respective test data required by a plurality of scan groups as test vectors transferred to the CUT;
   wherein the series of flip-flops of said test-data spreader includes a number L of flip-flops;
   wherein the test configuration switch receives the original input data, and
   wherein an output of the inverter and a number 2*L of outputs of the series of the flip-flops in said test data spreader constitute a maximum number of 2+2*L inputs into said test configuration switch.

2. The device as claimed in claim 1, wherein the multiplexers are simplified into an integrated switch logic by logic minimization.

3. The device as claimed in claim 1, wherein the CUT contains a plurality of scan chains that are divided into a plurality of scan groups; the scan chains in the same scan group share and receive the same test vector.

4. The device as claimed in claim 1, wherein the test controller receives a test enable signal that triggers the test controller to start test procedure.

5. The device as claimed in claim 1, wherein said control data received at said test controller is coupled to the test configuration switch to control switching of the test configuration switch.

6. A method for testing a circuit under test (CUT) using a test decompressor, comprising the steps of:
   Step 1: configuring a test decompression having a common test input terminal, a test data spreader coupled to said common test input terminal, a test configuration switch coupled to said test data spreader and said common test input terminal, and a test controller coupled to said test configuration switch and said common test input terminal;

Step 2: sending an enable signal to the test controller to start test procedure and outputting a select signal from said test controller to the test configuration upon receiving the enable signal to configure a test configuration;

Step 3: sending one piece of control data to the test controller by from said common single test input terminal, the control data containing a number indicating a number of test vectors to be used in the test configuration;

Step 4: transferring one piece of original input data to the test data spreader from said common test input terminal for converting the original input data into a plurality of test data;

Step 5: receiving, at said test configuration switch, the original input data from said common test input terminal, and the plurality of test data from said test data spreader, and selecting test data required by a plurality of scan chains of a circuit under test (CUT) as the test vector by the test configuration switch;

Step 6: outputting the test vector to the scan chains of the CUT by the test configuration of the test configuration switch according to the select signal received from the test controller, and subsequently applying the test vector to the CUT;

Step 7: running said Step 4, said Step 5, and said Step 5 repetitively until all the test vectors for the test configuration are transferred to the CUT;

Step 8: updating and outputting the select signal to the test configuration switch by the test controller for switching the test configuration to another test configuration; and Step 9: running said Step 3 through said Step 8, repetitively, until all test vectors for all test configurations are transferred to the CUT;

wherein the test data spreader includes an inverter and a series of flip-flops providing a true output and a complementary output;

wherein the test configuration switch receives the original input data, and wherein an output of the inverter and a number 2*L of outputs of the series of flip-flops forms a maximum number of 2+2*L of inputs in the test configuration switch.

7. The method as claimed in claim 6, wherein prior to said Step 2, the test controller receives a test enable signal that triggers the test controller to start a test procedure before starting the test using the test decompressor.

8. The method as claimed in claim 6, wherein the test controller receives a piece of test control data that controls switching of the test configuration switch.

* * * * *